(12) United States Patent
Deshpande et al.

(10) Patent No.: US 7,344,983 B2
(45) Date of Patent: Mar. 18, 2008

(54) CLUSTERED SURFACE PREPARATION FOR SILICIDE AND METAL CONTACTS

(75) Inventors: Sadanand V. Deshpande, Fishkill, NY (US); Ying Li, Newburgh, NY (US); Kevin E. Mello, Fishkill, NY (US); Renee T. Mo, Briarcliff Manor, NY (US); Wesley C. Natzle, New Paltz, NY (US); Kirk D. Peterson, Jericho, VT (US); Robert J. Purtell, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 183 days.

(21) Appl. No.: 10/907,061

(22) Filed: Mar. 18, 2005

(65) Prior Publication Data

US 2006/0211244 A1    Sep. 21, 2006

(51) Int. Cl.
 *H01L 21/44* (2006.01)
(52) U.S. Cl. .................. 438/682; 438/664; 438/680; 438/708; 438/723; 257/E21.165
(58) Field of Classification Search ............ None
See application file for complete search history.

(56) References Cited

U.S. PATENT DOCUMENTS

| | | | |
|---|---|---|---|
| 5,282,925 A | 2/1994 | Jeng et al. | |
| 6,184,132 B1 * | 2/2001 | Cantell et al. | ............. 438/664 |
| 6,204,120 B1 | 3/2001 | Gilboa et al. | |
| 6,207,582 B1 * | 3/2001 | Shields et al. | ............. 438/723 |
| 6,586,340 B2 | 7/2003 | Lee et al. | |
| 6,776,874 B2 | 8/2004 | Kobayashi et al. | |
| 2001/0001298 A1 | 5/2001 | Cantell et al. | |
| 2002/0144904 A1 | 10/2002 | Yoo | |
| 2002/0162742 A1 | 11/2002 | Bae et al. | |
| 2004/0092101 A1 | 5/2004 | Pyo et al. | |

* cited by examiner

*Primary Examiner*—Michael Lebentritt
*Assistant Examiner*—Kyoung Lee
(74) *Attorney, Agent, or Firm*—Scully, Scott, Murphy & Presser, P.C.; Yuanmin Cai

(57) ABSTRACT

A cluster tool is provided for the implementing of a clustered and integrated surface pre-cleaning of the surface of semiconductor devices. More particularly, there is provided a cluster tool and a method of utilization thereof in an integrated semiconductor device surface pre-cleaning, which is directed towards a manufacturing aspect in which a chamber for performing a dry processing chemical oxide removal (COR) on the semiconductor device surface is clustered with other tools, such as a metal deposition tool for silicide or contact formation, including the provision of a vacuum transfer module in the cluster tool.

5 Claims, 2 Drawing Sheets

CLUSTERED SURFACE PREPARATION FOR SILICIDE AND METAL CONTACTS

BACKGROUND OF THE INVENTION

1. Field of the Invention

The present invention relates to a cluster tool for the implementing of a clustered and integrated surface pre-cleaning of the surface of semiconductor devices. More particularly, the invention is directed to the provision of a cluster tool and to a method of utilization thereof in an integrated semiconductor device surface pre-cleaning, which is directed towards a manufacturing aspect in which a chamber for performing a dry processing chemical oxide removal (COR) on the semiconductor device surface is clustered with other tools, such as a metal deposition tool for silicide or contact formation, including the provision of a vacuum transfer module in the cluster tool.

Extensive experimentation and physical applications have been implemented in connection with the preparation of surfaces of semiconductor devices for the formation of silicide and metal contacts, employing so called cluster tools wherein, in particular, in order to effectuate the removal of surface films and thin layers of oxides, there are provided advantages in contrast with conventional wet etch based process flows.

Pursuant to the current state-of-the-art, which is concerned with various technical and economic aspects of semiconductor processing and manufacture, in order to fulfill a need for small or miniaturized geometries and improved performance characteristics, the contact module has attained an increased significance as an important element of chip yield and semiconductor device performance. For instance, in the currently employed 65 nm and 45 nm technologies, the requirements for a high-strength and low-resistance electrical path which make contact to the semiconductor device, are criteria which define limitations in the performance of the device.

Thus, in order to address the problems which are encountered by such performance limitations, consideration can be applied to techniques involving the applicability of chemical oxide removal (COR) based processes to the removal of deleterious surface oxides on the semiconductor surfaces which may present an impediment to the enabling of a good ohmic contact to semiconductor devices. In this connection, the presence of oxygen interfaces and oxygen contamination are serious problems encountered in contact module formulations and may result in significant performance and yield losses in advanced technology nodes.

To a significant extent, this problem has been addressed in U.S. Pat. Nos. 5,184,132 B1 and 5,282,925; and U.S. Patent Publication No. 2001/0001298 A1, all of which are commonly assigned to the assignee of this application, and the contents of which are incorporated herein in their entireties; and wherein U.S. Pat. No. 5,282,925 is discussed in further detail in connection with the present invention.

2. Discussion of the Prior Art

Pyo, et al., U.S. Patent Publication No. 2004/0092101 A1, discloses a Cu-thin film deposition equipment for a semiconductor device, which is intended to improve the speed of depositing a Cu-thin film, and resultingly lowering the corresponding manufacturing costs. Although there is provided a load lock for carrying out the film deposition steps before and after wafer processes, and wherein an aligner effectuates alignments so that a wafer reaches a desired position, a degassing chamber removes residue, such as gas produced on the surface of a wafer, whereas a feeding chamber is provided with a robot placing the wafer into and out of each chamber. There is no disclosure or suggestion of providing for a dry processing method comprising a chemical oxide removal (COR) of a surface film in a cluster tool, as in the present invention so as to provide for surface preparation for silicide and metal contacts on semiconductor devices.

Bae, et al., U.S. Patent Publication No. 2002/0162742 A1, describes a cluster tool for forming semiconductor devices using a wafer process including at least one load port at which wafers are loaded and wherein a front end system uses an ATM (atmosphere) robot and ATM aligner. There is no disclosure of employing a vacuum transfer system and cluster tool for chemical oxide removal, nor a dry processing operation to prepare a surface of a semiconductor device for silicide or metal contacts, as in the present invention.

Yoo, U.S. Patent Publication No. 2002/0144904, discloses a processing system and related method for vacuum evaporation of a material layer or film on a substrate. However, although there is provision made for a series of pumps for selecting processing pressure levels without the need for lowering the pressure to deep vacuum pressure conditions, there is no disclosure of a dry processing chamber for chemical oxide removal (COR), which is clustered with other tools, so as to prepare a clustered surface for silicide or metal contact formation on a semiconductor device.

Kobayashi, et al., U.S. Pat. No. 6,776,874 B2 discloses a processing method and apparatus for removing oxide films from a surface of an object which is to be treated through the intermediary of various gas treatments. However, there is no disclosure of a cluster tool and method utilizing a dry processing chamber for chemical oxide removal, including a metal deposition tool with a vacuum transfer module pursuant to the present invention, adapted to prepare a surface for silicide or metal contact formation.

Similarly, Lee, et al., U.S. Pat. No. 6,586,340 B2 and Gilboa, et al., U.S. Pat. No. 6,204,120 B1 disclose various pre-treatment methods for semiconductor wafers, and for subsequent processing, including transfer chambers and pluralities of vacuum conditions for removing native oxide films from the surface of a subject, such as cluster type wafers or the like. However, there is no description of a clustered surface preparation for silicide and metal films to form contacts in a dry process pre-cleaning (COR) operation using a clustered tool providing chemical oxide removal chambers and metal deposition chambers in conjunction with vacuum transfer chambers and load lock cluster arrangements, as is described by the present invention.

SUMMARY OF THE INVENTION

The present invention, in order to provide an advance in the processing of semiconductor devices, is, accordingly, directed to the provision of an integrated work tool and method for the clustered surface preparation of a semiconductor surface for the formation of silicide and metal contacts possessing low-resistance and high-ohmic electrical path characteristics. The inventive concept entails the utilization of the chemical oxide removal (COR) process of eliminating surface oxide films, such as native oxide, as an integrated process with coordinated subsequent metal depositions for silicide or contact formation.

Accordingly, in order to clearly distinguish and improve over the prior art, pursuant to the present invention, there is provided a cluster tool arrangement for a pre-cleaning oxide film removing surface preparation for enabling silicide and metal depositions on semiconductor devices by employing a cleaner integrated processing without a vacuum break and through an improved interface control. In particular, pursuant to the invention, the cluster tool arrangement replaces the current wet-etch based process flow by the provision of a dry method of processing which reduces the usage of wet chemicals and enables a cleaner application for surface preparation prior to implementing any metal deposition.

In particular, the invention utilizes a chemical oxide removal (COR) process and chamber, for instance, such as in U.S. Pat. No. 5,282,925; which selectively is employed among various types of oxides, such as native oxide, possibly employing gaseous nitrogen trifluoride ($NF_3$), or other gaseous mediums, which can conserve STI and control recess of the isolation so as to form improved silicides, for example, such as cobalt silicide, or suitable metals, such as titanium nitride, without any excessive STI oxide losses. Other patents and publications which are directed to the implementation of the COR process are U.S. Pat. No. 6,184,132 B1 and U.S. Patent Publication No. 2001/0001298 A1; which are commonly assigned to the present assignee, and the disclosures of which are incorporated herein in their entireties.

An even more specific advantage of the inventive dry processing using COR over wet processing is a differentiator for SOI technologies and, in particular, where contact to Box leakage is a major concern. In this connection, the SOI structures include an insulating layer, in effect, a buried oxide region (BOX), which, for instance, electrically isolates a top Si-containing layer from a bottom Si-containing layer, and wherein the top Si containing, or, in effect, the SOI layer serves as the area in which electronic devices, such as MOSFET (metal oxide semiconductor field effect transistor) devices are imparted a high degree of yield and efficiency.

Another improvement over the art provided for by the present invention relates to reduced queue times for processing lines, and improved raw processing times for the manufacture of contact and silicide modules.

Accordingly, it is an object to provide an improved and novel clustered surface preparation tool for an oxide-removing pre-cleaning and preparation for the silicide and metal contacts on semiconductor devices.

Another object resides in the provision of a method of providing for a dry-process based chemical oxide removal method employed in the pre-treatment of clustered and integrated surfaces for silicide and metal contact preparation for semiconductor devices and modules.

Yet another object resides in the provision of a cluster tool for the preparation of silicide and metal surfaces without a vacuum break and better interface control employing a cluster tool comprising a COR pre-clean chamber, a metal deposition chamber including a vacuum chamber in connection with a load lock for the rapid dry processing of semiconductor surfaces.

BRIEF DESCRIPTION OF THE DRAWINGS

Reference may now be made to the following detailed description of a preferred embodiment of the invention, taken in conjunction with the accompanying drawings, in which.

DETAILED DESCRIPTION OF THE INVENTION

Figure 1:
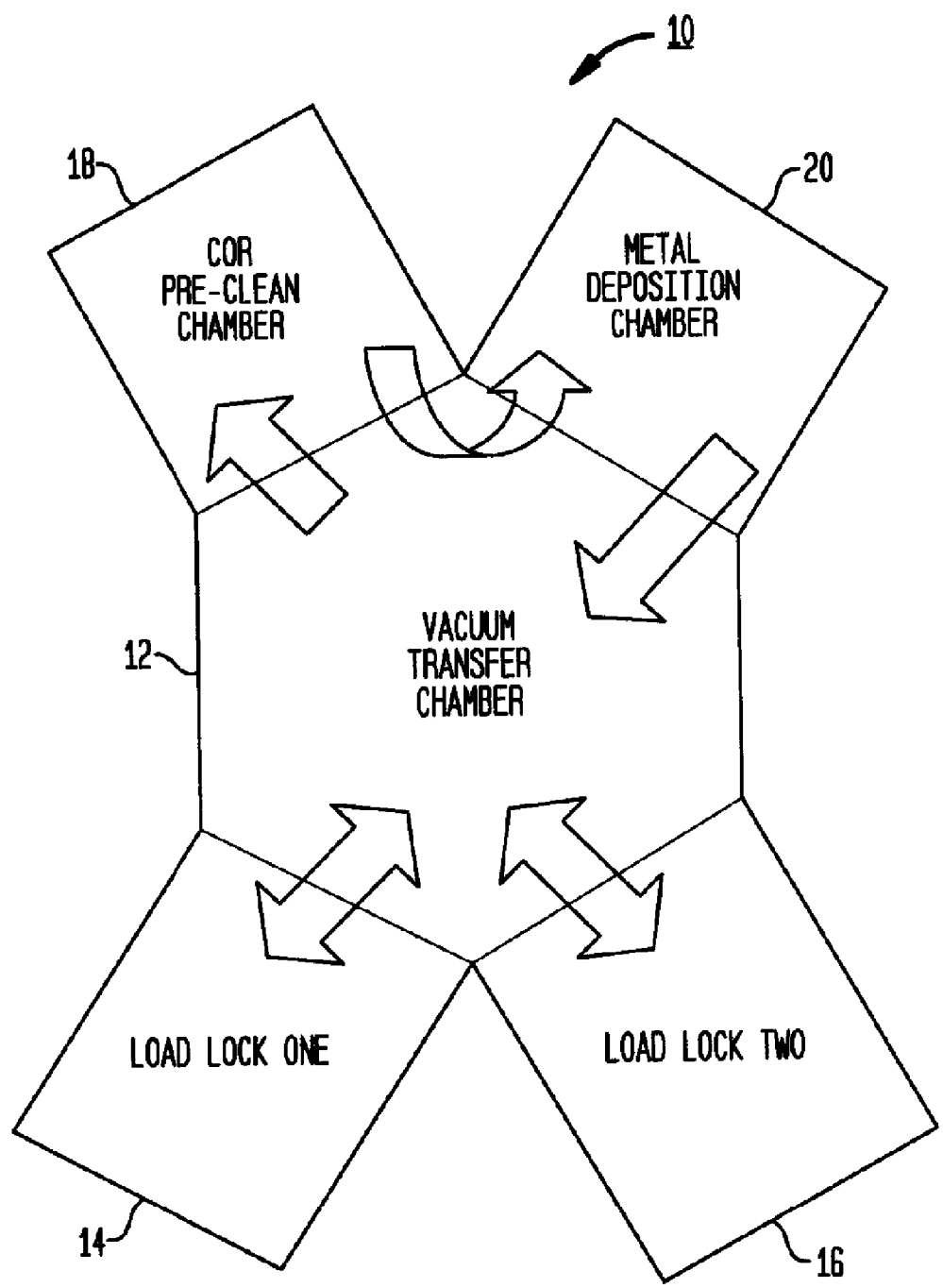
FIG. 1 illustrates a cluster tool arrangement for the surface pre-cleaning of a semiconductor device in a COR chamber, and which is integrated with the preparation of silicide and metal contacts.

Referring to FIG. 1 of the drawings, there is diagrammatically illustrated a cluster tool arrangement 10, comprising a vacuum transfer chamber 12, and providing for a first load lock 14 and a second load lock 16 for the transferring in and removal of workpieces, such as semiconductor wafers (not shown), which are to be pre-cleaned in a (COR) chamber 18 by means of a dry process consisting of chemical oxide removal (COR) methods, and then treated in a metal deposition chamber 20. The load-locks 14, 16; COR pre-cleaning chamber 18 and metal deposition chamber 20 are clustered about the vacuum through chamber 12.

Figure 2:
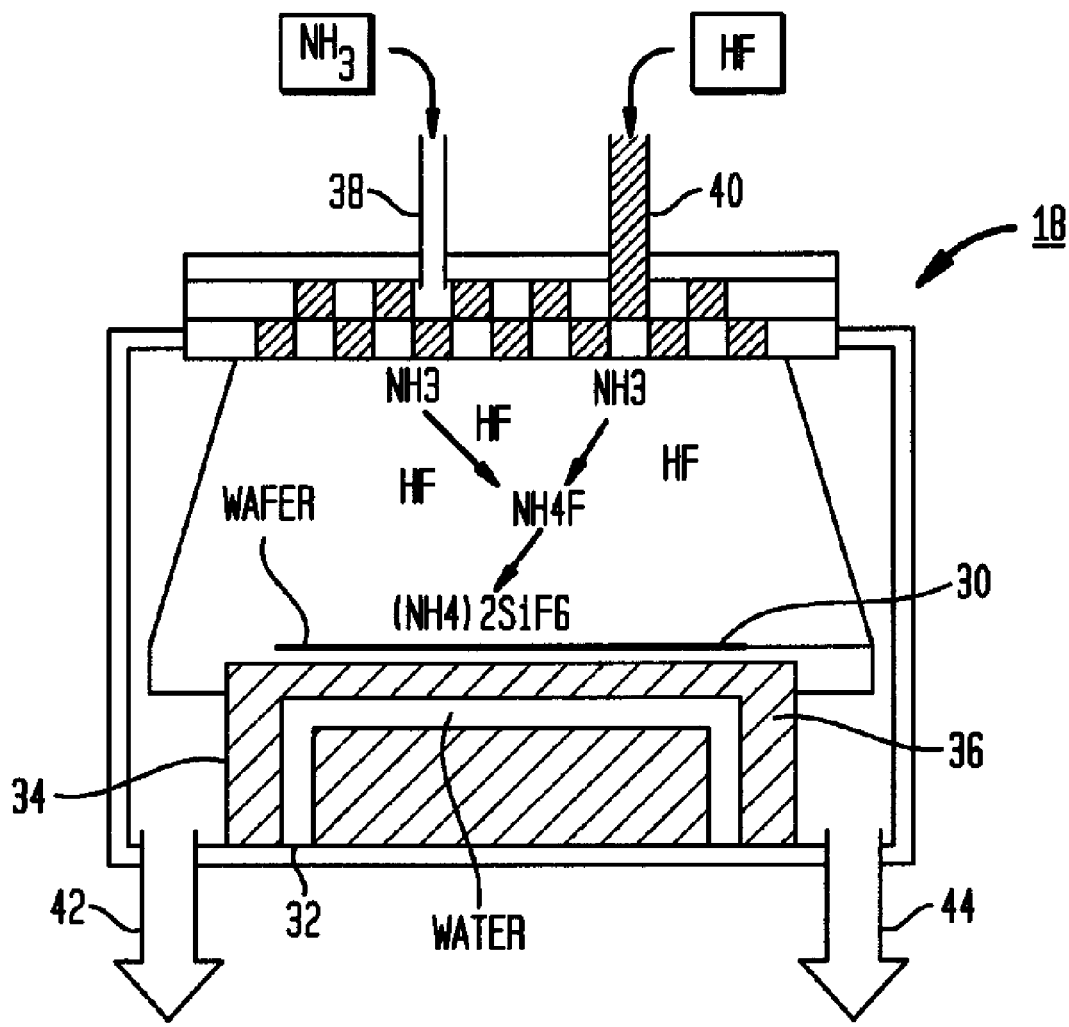
FIG. 2 illustrates, generally diagrammatically, an apparatus for implementing the chemical oxide removal (COR) process, as known in the prior art.

Referring, in particular, to the schematic representation, as illustrated in FIG. 2 of the drawings, this discloses, diagrammatically, the pre-treatment chemical oxide removal (COR) chamber 18, which is employed in connection with the cluster tool arrangement 10, pursuant to the present invention.

In particular, the pre-treatment COR chamber 18, as diagrammatically disclosed herein, is described in detail in particular connection with FIG. 4 of Jeng, et al., U.S. Pat. No. 5,282,925, which is commonly assigned to the present assignee, and the disclosure of which is incorporated herein in its entirety.

In this connection, the CDR pre-treatment chamber 18 provides for a low-pressure and plasma-free and damage-free etching of silicon dioxide on a wafer surface, wherein the wafer is represented by reference numeral 30 in the drawing.

Hereby, the pre-treatment chamber 18 is provided with water through the passageway 32, wherein the wafer 30 is positioned on the upper surface of the support structure 34 and may be heated by means of a suitable heating arrangement, such as coils 36 or the like.

The pressure in the pre-treatment chamber 18 may be suitably controlled, as is described in the foregoing U.S. Pat. No. 5,282,925 and gaseous mixtures of ammonia ($NH_3$) and hydrogen fluoride HF are injected into the interior of the chamber 18 through respective inlet conduits 38 and 40.

In effect, through suitably controlled pressure and temperature conditions, as described in U.S. Pat. No. 5,282,925, chemical oxide removal (COR) is implemented in an essentially two-step reaction in which in a first step, solid reaction product $(NH_4)_2SiF_6$ is formed on the oxide surface which is present on the wafer 30 and self limits the reaction. This enables a controlled removal of oxide for the wafer surface pre-clean preparation. Thereafter, in a second step, the reaction product is removed through discharge sublets 42, 44 by heating (sublimation) responsive to the heat of the reaction being controlled (not shown) by a suitable controller acting on heating coils 36, the latter of which are diagrammatically represented in the drawing.

The particular conditions for the implementation of the chemical oxide removal (CDR) process are detailed in the disclosure of U.S. Pat. No. 5,282,925 and a detailed repetition thereof in the present specification is deemed to be unnecessary for an understanding of the invention.

In particular, the cluster tool arrangement 10 provides for a selective cleaning of different types of oxides from the surfaces of the semiconductor device or wafer so as to control and conserve STI oxide losses. Hereby, the semiconductor device or wafer is transported into a respective load lock 14, 16, and from there into vacuum transfer chamber 12. Thereafter, under vacuum condition, the wafer (or semiconductor device) is conveyed into pre-cleaned chamber 18, which basically comprises the COR (chemical oxide removal) apparatus for effecting an oxide-removing cleaning sequence on the wafer surface. Upon completion of the removal of oxide film or surface deposition, the wafer is then transferred back to the vacuum transfer chamber 12 and then into metal deposition chamber 20, where the appropriate metal deposition of silicides or other metals, as known, is imparted to the surface of the semiconductor device or wafer to produce the desired contacts possessing high-strength and high-ohmic electrical path characteristics. The wafer metal or silicide-forming surface preparation having been completed, the wafer or semiconductor module is transferred back to the vacuum transfer chamber 12 and from there to one of the load locks 14 or 16 for further conveyance and processing at a further site in accordance with the prevailing technology.

While the present invention has been particularly shown and described with respect to preferred embodiments, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for the integrated pre-cleaning of a semiconductor surface and surface preparation for forming metal and silicide contacts thereon; wherein said method is implemented in a cluster tool for the removal of a dry chemical oxide by a gaseous medium operating under a vacuum condition; comprising a plurality of segmented steps of:

providing a silicon semiconductor substrate having a native oxide film present on a surface thereof;

uninterruptedly and continuously imparting said vacuum condition to said semiconductor surface during the implementation of said method having said oxide film thereon;

performing said dry processing chemical oxide removal (COR) in a plasma-free application resulting in the absence of a plasma on said semiconductor surface for removing said native oxide film, while maintaining said vacuum condition so as to produce an oxygen-free semiconductor surface; and without breaking said vacuum condition in order to avoid an exposure of said surface to air, depositing a metal on said oxygen-free semiconductor surface and forming said silicide and metal contacts on said surface.

2. A method as claimed in claim 1, wherein said gaseous medium comprises nitrogen trifluoride ($NF_3$).

3. A method as claimed in claim 1, wherein said metal is cobalt.

4. A method as claimed in claim 1, wherein said silicide is cobalt silicide.

5. A method as claimed in claim 1, wherein said metal is titanium for forming a titanium nitride on said semiconductor surface.

* * * * *